United States Patent [19]

Mathew

[11] Patent Number: 4,922,322

[45] Date of Patent: May 1, 1990

[54] BUMP STRUCTURE FOR REFLOW BONDING OF IC DEVICES

[75] Inventor: Ranjan J. Mathew, San Jose, Calif.

[73] Assignee: National Semiconductor Corporation, Santa Clara, Calif.

[21] Appl. No.: 308,704

[22] Filed: Feb. 9, 1989

[51] Int. Cl.$^5$ .............................. H01L 23/48
[52] U.S. Cl. ...................... 357/69; 357/71; 228/123
[58] Field of Search ............. 357/68, 69, 71; 228/123, 124, 180.2, 263.12, 254

[56] References Cited

U.S. PATENT DOCUMENTS

| | | | |
|---|---|---|---|
| 3,141,226 | 7/1964 | Bender et al. | 228/123 |
| 4,244,002 | 1/1981 | Sato et al. | 357/71 |
| 4,418,857 | 12/1983 | Ainslie et al. | 228/124 |
| 4,494,688 | 1/1985 | Hatada et al. | 228/180.2 |
| 4,502,210 | 3/1985 | Okumura et al. | 357/68 |
| 4,518,112 | 5/1985 | Miller et al. | 228/124 |

FOREIGN PATENT DOCUMENTS 188848  11/1982  Japan ................ 228/180.2

*Primary Examiner*—Nicholas P. Godici
*Assistant Examiner*—Samuel M. Heinrich
*Attorney, Agent, or Firm*—Gail W. Woodward; Lee Patch; Michael A. Glenn

[57] ABSTRACT

In a semiconductor device tape assembly bonding process the fingers of a copper tape are reflow soldered to metal bumps located on the semiconductor device. First, the semiconductor wafer is covered with a conductive film composed of thin layers of alumimum, nickel-vanadium alloy and gold. The bumps are then created by electroplating gold through openings in a photoresist mask. The gold bumps are overcoated with a controlled thickness tin layer and the tin is overcoated with a thin gold anticorrosion layer. The copper assembly tape is coated with a thin gold layer and are lightly pressed against the bumps by means of a thermode. The thermode is quickly heated to a temperature well above the gold-tin eutectic melting temperature and then rapidly cooled. The tin layer on the bump will combine with the adjacent gold to form a liquid phase eutetic which will form and contact both the copper finger and the gold bump. Upon cooling the eutectic melt will solder the finger to the bump. Since all of the tin is combined with the gold there is no metallic tin left in the system and the problems of tin whiskers and tin electromigration are avoided.

1 Claim, 1 Drawing Sheet

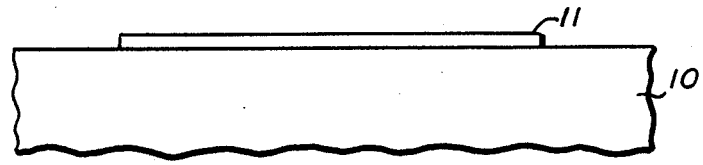
Fig_1
Fig_2
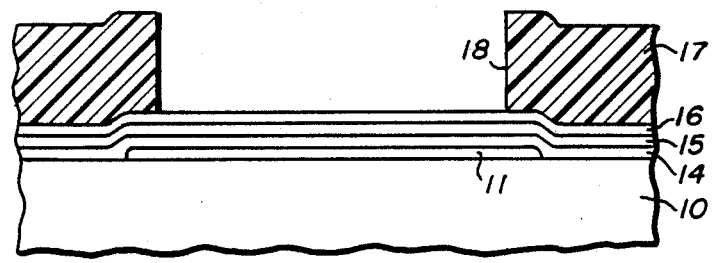
Fig_3
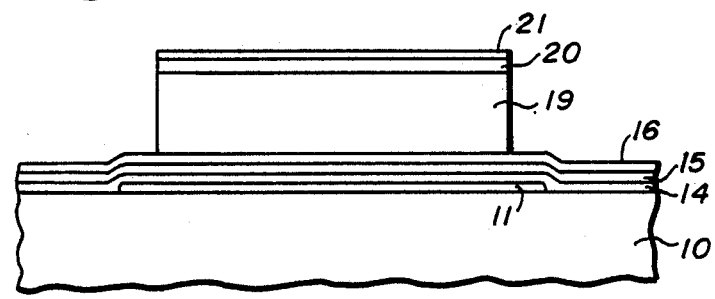
Fig_4
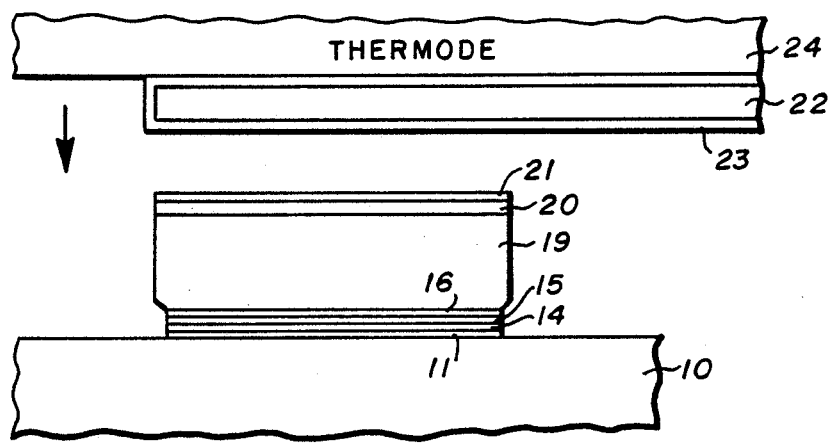
Fig_5
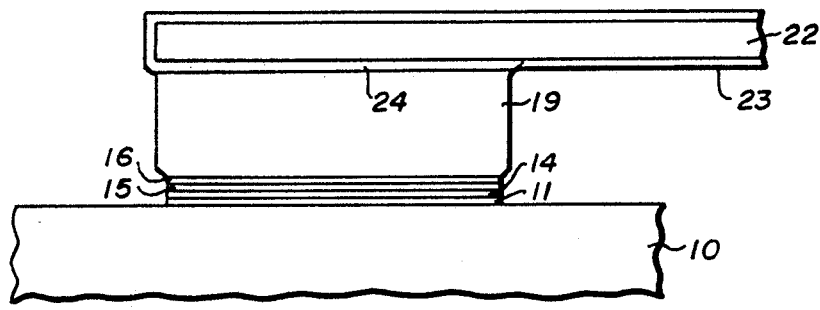
Fig_6

BUMP STRUCTURE FOR REFLOW BONDING OF IC DEVICES

BACKGROUND OF THE INVENTION

The invention relates to the forming of connections to the bonding pads on integrated circuit (IC) devices. Monolithic silicon IC devices commonly employ an array of aluminum film bonding pads usually disposed around the periphery of the individual chips. It is common practice to treat a silicon wafer containing a plurality of IC chips to simultaneously form bumps on all of the bonding pads. Typically, the bumps are composed of gold, silver or copper in the tape automated bonding (TAB) process. Copper tape fingers are bonded to the bumps after the chips are separated from the wafer. Alternatively, the bumps are composed of solder and the flip-chip assembly approach employed. Her the chip is inverted so that the solder bumps face the traces on a printed wiring PW substrate. The chips are pressed against the substrate and heat is applied to fuse the solder which melts and bonds the chip to the substrate.

In the TAB approach the tape fingers can be thermocompression (TC) bonded or they can be reflow soldered to the bumps. With reflow soldering, it is common to tin plate the copper tape fingers and to either employ gold bumps or gold plate the copper bumps. The fingers are pressed against the bumps and heat is applied to exceed the gold-tin eutectic. The gold and tin combine to form a eutectic solder that will bond the copper to the bumps.

Each of these prior processes suffer drawbacks. When solder bumps are employed their fusion causes them to lose their original geometry. Furthermore, solder bumps are not amenable to TAB because a PW substrate is required. The TC process for attaching metal fingers to the bumps involves substantial pressure. In many cases, particularly for high lead count IC chips, the total pressure can produce stresses that adversely affect reliability. In the case of tin plated TAB tape, special handling must be employed if the tape is to be stored. Furthermore the formation of tin whiskers can occur to the detriment of assembled devices. If a tin surface is exposed, inside a finished device, tin whiskers can form and short out the leads. Finally, the tin can electromigrate in the presence of applied voltages and produce lead shorting.

SUMMARY OF THE INVENTION

It is an object of the invention to provide a suitable metallization scheme for making contact between semiconductor IC chip bonding pads and the metal fingers of an assembly tape.

It is a further object to employ reflow soldering to join metal tape fingers to the bumps on semiconductor IC chip bonding pads so that a low force method of making contact is available.

It is a still further object of the invention to form a gold bump on each of the bonding pads on an IC chip and to overcoat the bump with a layer of tin and a thin layer of gold with contact being made to a gold plated copper tape finger whereby a gold-tin eutectic solder is formed upon heating which completely consumes the tin and acts to join the copper finger to the gold bump without applying undue pressure.

The invention relates to the use of reflow solder to attach copper metal fingers to gold bumps using a gold-tin eutectic solder. The gold bump is electro-plated using a conventional resist masking. The top of the gold bump is covered with a layer of tin of controlled thickness and a thin layer of gold. The copper fingers are covered with a corrosion resistant gold layer. Thus, when the fingers are pressed against the bumps a gold-to-gold contact is present. The fingers are then heated above the tin-gold eutectic at which time the tin plating on the bump will combine with the gold and form a liquidus phase to provide a reflow solder that joins the copper finger to the gold bump. The volume of tin is selected to completely absorb the gold cover over the tin and the gold on the copper finger. Any additional gold required to form the eutectic, will be absorbed from the bump to completely convert all of the tin to eutectic alloy. After the solder has solidified, there is no exposed tin in the contact system.

In forming the gold bumps the silicon wafer with its exposed aluminum bonding pads, is completely covered with successive thin layers of aluminum, nickel-vanadium alloy and gold. These layers will underlay the gold bumps and provide a conductive surface that can be electroplated. The wafer is then covered with photoresist which has openings located where bumps are to be created. Then gold is electroplated to a desired bump thickness. Then a controlled thickness of tin is electroplated on top of the gold bump followed by a gold cover. This final cover is made thin, but is thicker than the gold overcoat on the wafer. Then the photoresist is removed thereby leaving the gold bumps with their overcoats of tin and gold. At this point, a chemical gold etch is employed to remove the wafer substrate gold cover. When this is done, a thin layer of gold will remain over the bump because it was made thicker originally. Then a second chemical etch is employed to remove the nickel-vanadium and a third chemical etch selectively removes the aluminum layer. The bumps are then ready for contacting.

The wafer is then diced into chips which are individually assembled using TAB. The copper assembly tape is first coated with gold so that when the tape fingers are lightly pressed against the bumps a gold-to-gold contact is achieved. This step can involve a very low pressure because it does not do the bonding. A bonding tool is gently pressed against the tape fingers and its temperature quickly raised to a level that will raise the fingers temperature above the 280° C. eutectic. The gold-tin eutectic will form thereby absorbing all of the tin. When cooled the eutectic will form a solder that bonds the copper fingers to the gold bumps.

BRIEF DESCRIPTION OF THE DRAWING

FIG. 1 is a cross-section of a wafer portion showing a bonding pad.

FIG. 2 shows the wafer portion of FIG. 1 covered with a succession of metal layers.

FIG. 3 shows the wafer portion of FIG. 2 covered with photoresist having openings over the center of the bonding pad.

FIG. 4 shows the wafer portion of FIG. 3 with gold, tin and gold layers electroplated within the photoresist openings.

FIG. 5 shows the wafer portion of FIG. 4 with a copper finger ready for soldering.

FIG. 6 shows a copper finger soldered to a gold bump using a gold-tin eutectic solder.

It is to be understood that the drawing is not to scale. The vertical dimensions are distorted for clarity. The intent is only to show the layer sequences.

DESCRIPTION OF THE INVENTION

In FIG. 1 substrate 10 represents a fragment of a semiconductor wafer into which a number of IC devices (not shown) are fabricated. As a practical matter substrate 10 is typically the surface or field oxide that overlies the actual semiconductor substrate. While not shown, each IC includes a series of bonding pads that are to be contacted for connection to electrical elements exterior to the IC. Element 11 represents one such bonding pad. Typically, it is a layer of aluminum.

Then, as shown in FIG. 2, the wafer is coated with successive layers of aluminum 14 nickel-vanadium alloy 15 and gold 16. It is preferred that these layers be respectively about 6K, 2K and 2K angstroms thick. The aluminum layer contacts the bonding pad 11 and adheres well to the substrate, the nickel-vanadium alloy forms a stable barrier layer and the gold layer provides a conductive antioxidation sealing layer that will accept the layers to follow. These three layers are desirably vacuum deposited in sequence, from three separate sources, in a vacuum deposition chamber without breaking the vacuum. Thus, layers 14–16 form a metallic continuum on the wafer.

Then, as shown in FIG. 3, a layer of photoresist 17 is applied to the wafer as a mask having an aperture at 18 centered over pad 11. Since layers 14–16 form a conductive continuum over the wafer, subsequent layers can be electroplated. A gold bump 19 can be electroplated as shown. Bump 19 is about 30 microns thick and is desirably achieved using a gold sulfite electrolyte at a pH of 9.5 and a current density of about 54 amperes per square meter (ASM). The plating is continued for about 110 minutes. The wafer is then rinsed in deionized water for two minutes. Then, a layer of tin 20 is electroplated to a thickness of about 3.65 microns using a sulfonic acid electrolyte operated at about 108 ASM for about three minutes. A five minute rinse in deionized water follows. Then a layer of gold 21 is electroplated to a thickness of about 0.6 micron in a gold cyanide electrolyte at a current density of about 54 ASM for about three minutes. This is followed by a five minute deionized water rinse and drying.

The most important element in the preferred process is that gold layer 21 be thicker than gold layer 16. By doing this, in the next sequence layer 16 can be fully etched away without removing all of layer 21. Layer 16 is removed by immersing the wafer in a cyanide stripper at 40°–50° C. for about 30 seconds. This will effectively remove about 4K angstroms of gold which ensures that all of layer 16 is removed. However, it still leaves about 2K angstroms of layer 21. This is followed by a five minute rinse in deionized water. Then the nickel-vanadium alloy layer 15 is removed by immersing the wafer in a nitric acid, acetic acid and hydrogen peroxide mixture for about fifteen seconds. Another five minute deionized water rinse follows. Then, the aluminum layer 14 is removed in a mixture of phosphoric and acetic acids during a fifty second immersion. This is followed by a five minute deionized water rinse and the wafer is dried. It now looks like the FIG. 5 showing. It will be noted that the gold etch slightly undercuts the bump structure. However, this is of little, if any, significance.

FIG. 5 also shows a copper finger end 22 poised over the completed bump structure. It is typically coated with a layer of gold 23 about 0.75 micron thick. In the bonding operation a bonding tool 24 is employed to lightly press the gold coated copper finger against the tin and gold coated gold bump face. The thermode is rapidly heated to about 500° C. for less than a second and then cooled. When the copper finger temperature exceeds about 280° C., the gold-tin eutectic forms and the gold mixes with the tin to form a liquid phase which exists between the copper finger and the gold bump.

As the bonding temperature rises to form the eutectic melt the tin in layer 20 will first combine with the gold in layer 21 and the gold in layer 23 on finger 22. The volume of tin in layer 20 desirably exceeds that amount necessary to entirely dissolve gold in layers 21 and 23. Then any additional gold needed to satisfy the eutectic melt will be drawn from bump 19. In this way tin layer 20 is completely consumed to form a gold-tin eutectic alloy 24. This alloy in its molten form is in direct contact with copper finger 22 and gold bump 19. Upon solidification finger 22 will be reflow soldered to bump 19 by eutectic alloy 24 as shown in FIG. 6. It has been found that the pull strength of the tape fingers bonded in the above-described manner equal or exceed the bonds achieved using TC gang bonding. After bonding there is no tin left in the system. The gold-tin eutectic solder is stable in that it does not form whiskers or electromigrate under applied potentials.

While the preferred embodiment employs a gold bump, other alternatives are available. For example, bump 19 can be composed of copper overcoated by a relatively thick layer of gold. Also, the bump can be composed of silver, if desired. These alternatives employ less gold and are attractive in terms of cost.

When a person skilled in the art reads the foregoing description, other alternatives and equivalents, within the spirit and intent of the invention, will be apparent. Accordingly, it is intended that the scope of the invention be limited only by the following claims.

I claim:

1. A tape assembly bonded semiconductor device comprising:
    a semiconductor device having at least one aluminum bonding pad;
    layers of aluminum, nickel-vanadium alloy and gold successively overlying said aluminum bonding pad;
    a gold bump located on said semiconductor device over said gold layer, said gold bump having an outer surface;
    a copper tape finger associated with an assembly tape; and
    a gold-tin eutectic solder joining said copper tape finger to said outer surface of said gold bump wherein there is a complete absence of metallic tin in said bonded semiconductor device.

* * * * *